US012591002B2

(12) United States Patent
Chang et al.

(10) Patent No.:    US 12,591,002 B2
(45) Date of Patent:      Mar. 31, 2026

(54) ANOMALY DETECTION AND PROTECTION

(71) Applicant: ZERO-ERROR SYSTEMS PTE. LTD., Singapore (SG)

(72) Inventors: Joseph Sylvester Chang, Singapore (SG); Kwen Siong Chong, Singapore (SG); Wei Shu, Singapore (SG); Arunjai Mittal, Singapore (SG)

(73) Assignee: ZERO-ERROR SYSTEMS PTE. LTD., Singapore (SG)

( * ) Notice: Subject to any disclaimer, the term of this patent is extended or adjusted under 35 U.S.C. 154(b) by 138 days.

(21) Appl. No.: 18/179,980

(22) Filed: Mar. 7, 2023

(65) Prior Publication Data

US 2023/0288470 A1    Sep. 14, 2023

(30) Foreign Application Priority Data

Mar. 8, 2022    (SG) ............................ 10202202290T

(51) Int. Cl.
G01R 31/28        (2006.01)
G06N 3/08        (2023.01)

(52) U.S. Cl.
CPC .............................. G01R 31/2851 (2013.01)

(58) Field of Classification Search
CPC ........ G06N 3/08; H04L 63/1433; H04L 43/08
See application file for complete search history.

(56) References Cited

U.S. PATENT DOCUMENTS

| | | | | | |
|---|---|---|---|---|---|
| 7,184,238 | B1 * | 2/2007 | Ostwald | ................. | G11B 17/22 |
| 7,342,763 | B2 * | 3/2008 | Mladenik | ................ | H02H 3/00 |
| | | | | | 361/119 |
| 9,031,824 | B2 | 5/2015 | Nasle | | |
| 9,582,349 | B1 * | 2/2017 | Schmit | .................. | G06F 11/073 |
| 10,289,178 | B1 | 5/2019 | Lynam et al. | | |
| 10,566,780 | B2 | 2/2020 | Chang et al. | | |
| 2007/0091527 | A1 | 4/2007 | Julicher | | |
| 2008/0151456 | A1 | 6/2008 | Julicher | | |
| 2009/0089719 | A1 * | 4/2009 | Gauthier, Jr. | ........ | H10D 89/819 |
| | | | | | 716/100 |
| 2018/0248351 | A1 * | 8/2018 | Vail | ......................... | H02H 5/005 |
| 2022/0099728 | A1 * | 3/2022 | Blanchard | .............. | H02H 3/044 |

FOREIGN PATENT DOCUMENTS

EP            3125389 A1      2/2017

OTHER PUBLICATIONS

Foreign Communication from a Related Counterpart Application, Extended European Search Report dated Jul. 28, 2023, European Patent Application No. 23160688.0.

(Continued)

*Primary Examiner* — Huy Q Phan
*Assistant Examiner* — Temilade S Rhodes-Vivour
(74) *Attorney, Agent, or Firm* — Conley Rose, P.C.

(57)              ABSTRACT

An apparatus for detecting an anomaly in an electronic system embodying at least two integrated circuits, and where necessary, removing/mitigating the anomaly. The anomaly detection is based on sensing the characteristics of either the current, the voltage, or both the current and voltage of the supply rail connected to the at least two integrated circuits. When an anomaly occurs, the anomaly is detected by one sensing circuit sensing that the characteristics are different from that when the electronic system is functioning normally.

19 Claims, 10 Drawing Sheets

(56)                References Cited

OTHER PUBLICATIONS

Wächter, et al., "Using Machine Learning for Anomaly Detection on a System-on-Chip under Gamma Radiation", arxiv.org, Cornell University Library, Ithaca, NY, Jan. 5, 2022, XP091132290.
Dorise, et al. "Machine learning as an alternative to thresholding for space radiation high current event detection," IEEE Transactions on Nuclear Science, Sep. 2021. pp. 1-8.
Mousavi, et al. "Earthquake transformer—an attentive deep learning model for simultaneous earthquake detection and phase picking," Nature Communications, Aug. 2020. pp. 1-12.

* cited by examiner

ANOMALY DETECTION AND PROTECTION

CROSS-REFERENCE TO RELATED APPLICATION

This application claims the benefit of priority of Singapore patent application No. 10202202290T, filed 8 Mar. 2022, the content of it being hereby incorporated by reference in its entirety for all purposes.

TECHNICAL FIELD

Various embodiments relate to electronic designs to detect an anomaly in an electronic system, and where possible remove or mitigate the anomaly. The anomaly may be due to radiation effects, malfunction, computational errors, etc.

BACKGROUND

In some applications, including on-earth and space/satellite applications, the reliability of electronic systems embodying (including integrated circuits (ICs), System-on-Chip (SoC), System-in-Package (SiP), etc.; henceforth collectively termed ICs), is one of the most important design considerations. To enhance the reliability of the electronic system, it is useful to detect the occurrence of an anomaly and if possible, provide means to remove or mitigate the anomaly. The anormal may be due to radiation effects include single-event effects—single-event-latchup (SEL), single-event-transient and single-event-upset—or total-ionization dosage, enhanced low dose rate effects, neutron and proton displacement damage. It may also be due to non-radiation effect failures such as malfunction, computation errors, etc.

In the case of an SEL anomaly, a short-circuit may be induced within the IC and this may render non-functionality of and damaging the IC. The range of the SEL current (the short-circuit current) is wide. When it is high, e.g., 5× the operating current, it is easily detected by means of a current sensor whose threshold (e.g., 4×) is lower than the SEL current. When the threshold is exceeded, i.e., an anomaly is detected, and power-cycling (disconnecting and reconnecting the specific power rail (or some or all of the power rails) to the IC) is activated to remove the SEL.

In addition to SELs, there are micro-SELs where their short-circuit current may be very low—possibly much lower than the operating current of the IC. In some ICs, such as a complex Field Programmable Gate Array (FPGA), the micro-SEL (and SEL) current is variable. Because of its low current and variability, it is difficult to detect. Nevertheless, it is important to detect and remove both SEL and micro-SEL in an IC because they compromise reliability.

For completeness, a complex integrated circuit, such as an SoC (e.g., an FPGA) may be considered an electronic system and considered as embodying several ICs and/or several electronic devices.

Such anomalies may also occur in due to other faults such as malfunction, computation errors, etc., and the range of the ensuing current drawn by the IC with anomality is also large. Such anomalies may also be difficult to detect.

Hitherto, the detection of SELs and micro-SELs are limited to monitoring the current in one power rail [1] connected to one pin of an IC. There is also some nascent effort to employ machine-learning (ML) to detect SELs and micro-SELs. Nevertheless, the Machine Learning (ML)

efforts [2] are similarly limited to monitoring the current in one power rail and the algorithm is simplistic, rendering limited detection accuracy.

SUMMARY

In an embodiment, an apparatus for detecting an anomaly in an electronic system is disclosed. The apparatus comprises a power rail connected between a power source and a supply rail, the supply rail connected to a distributed power rail, and the distributed power rail connected to a first sub-supply rail and to a second sub-supply rail. The apparatus also comprises a first electronic device and a second electronic device. The first sub-supply rail is connected to a first pin of the first electronic device or a first pin of the second electronic device. The second sub-supply rail is connected to a second pin of the first electronic device or to a second pin of the second electronic device. The apparatus additionally comprises a signal processing system that includes a sensing circuit. The sensing circuit senses the characteristics of the current, the voltage, or both the current and voltage of the power rail or the supply rail and detects the anomaly when the anomaly occurs in either the first electronic device or the second electronic device or both electronic devices In another embodiment, a method for detecting an anomaly in an electronic device is disclosed. The method comprises sensing, by a sensing circuit of a signal processing system in the electronic system, characteristics of the current, the voltage, or both the current or voltage of a power rail of the electronic system or a supply rail of the electronic system. The power rail is connected a power source and to the supply rail, The supply rail is connected to a distributed power rail. The distributed power rail is connected to a first sub-supply rail and to a second sub-supply rail. The first sub-supply rail is connected to a first pin of a first electronic device or to a first pin of a second electronic device or to the first pin of both the first and the second electronic devices. The second sub-supply rail is connected to a second pin of the first electronic device or to a second pin of the second electronic device or to the second pin of both the first and the second electronic devices. The method also comprises when the anomaly occurs in either the first electronic device or the second electronic device or both the electronic devices, detecting the anomaly by the sensing circuit sensing that the characteristics are different from that when the electronic system is functioning normally.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
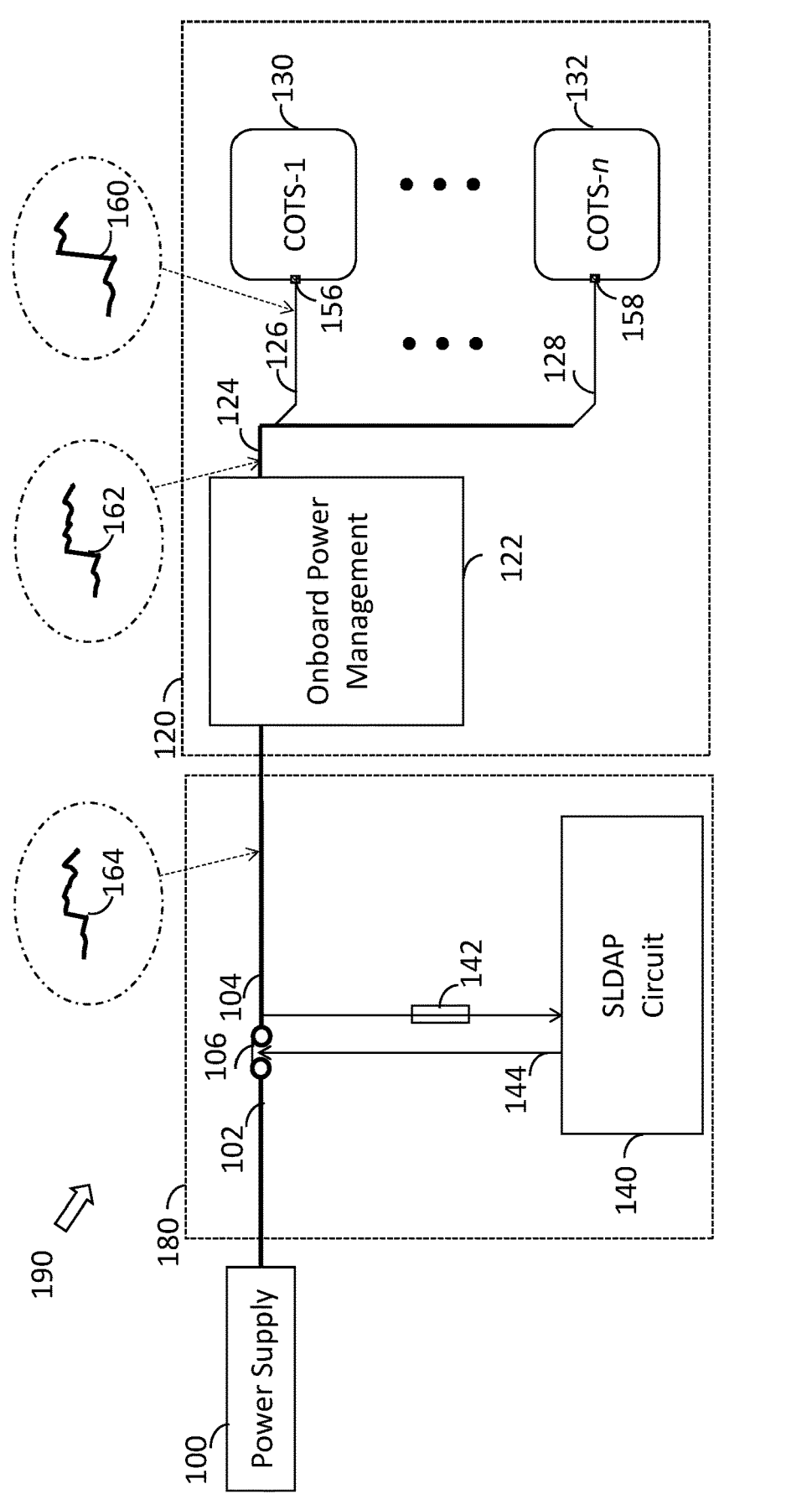
FIG. 1 is a first example of an electronic system having an anomaly detection methodology by sensing the supply rail according to the embodiment, to detect/qualify an anomaly occurring within at least one electronic device in a COTS system.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The description herein refers to the accompanying drawings that show, by way of illustration, specific details and embodiments in which the invention may be applied. These embodiments are delineated in detail to enable the skilled in the art to supply the invention.

As used herein, the term "and/or" includes any and all combinations of one or more of the associated listed items.

According to an aspect of the present disclosure, there is provided an apparatus for detecting an anomaly in an electronic system in part embodying a COTS system having at least two ICs (which may be in one complex IC, e.g., FPGA), where necessary for removing/mitigating the anomaly. The anomaly may be due to radiation effects or non-radiation effect failures such as malfunction and computation errors. The anomaly detection is based on the sensing the characteristics of either the current, the voltage, or both the current and voltage electrically coupled to the COTS system, and when an anomaly occurs, the anomaly is detected by one sensing circuit sensing that the characteristics are different from that when the electronic system is functioning normally (i.e., without an anomaly).

In some embodiments, the anomaly detection methodology involves the employment of a processing unit (or signal processing circuit) having pre-characterized anomaly characteristics of one or both ICs or any other IC or any power management circuit in part embodied in the COTS system. When the anomaly occurs, the processing unit correlates the pre-characterized anomaly characteristics of one or both ICs or any other IC or any power management circuit with the sensed characteristics by the sensing circuit.

In some embodiments, the anomaly detection methodology causes the COTS system to be temporarily or permanently electrically decoupled from the power source or to be electrically discharged to a lower voltage, so that anomaly in the electronic system can be removed/mitigated.

In some embodiments, the anomaly detection methodology involves the use of an analog processing unit, or a digital processing unit or a mixed-signal processing unit.

In some embodiments, the anomaly detection methodology involves having two sensing circuits sensing the characteristics of two currents, voltages, or both the currents and voltages electrically coupled to the COTS system. When an anomaly occurs, the anomaly is detected by at least one of the two sensing circuits sensing that the characteristics are different from that when the electronic system is functioning normally.

In some embodiments, the anomaly detection methodology is to have one sensing circuit sensing the characteristics of the current, the voltage, or both the current or voltage electrically coupled to the COTS system and to have one output signal monitoring the operational condition status on the COTS system. When an anomaly occurs, the anomaly is detected by the sensing circuit sensing that the characteristics are different from that when the electronic system is functioning normally. It is also detected by monitoring the output signal which is an indication of the operational condition of the COTS system.

In some embodiments, the anomaly detection methodology involves the employment of statistical parameters of the characteristics of the signal sensed by the sensing circuit for its detection of an anomaly, and where necessary to facilitate the anomaly detection by machine learning algorithms by means of labelling, training and weighting the statistical parameters.

The system having the anomaly detection methodology according to some embodiments of the present disclosure is different from and improves the anomaly detection over the existing systems. For example, a prior-art is an over-current protection by merely sensing a load current of the system and then comparing the load current against a pre-determined threshold. The system according to some embodiments of the present disclosure is beyond an over-current protection. Another prior-art is a chip-level latch-up current protection [1], [2] to protect only one single IC—not in a system—by sensing a latch-up current directly flowing into the IC, and thereafter detecting the latch-up event (if any) from the latch-up current. Further, there is no correlation between any ICs as the protection is for only one IC. The system according to some embodiments of the present disclosure is a system-level protection to protect at least two ICs, by embodying signal processing intelligence to correlate the pre-characterized anomaly characteristics of one or both ICs or any other IC or any power management circuit with the sensed characteristics by the sensing circuit. The correlation may be established by processing a correlation threshold value which may be a binary value, a probability value, or a relative change of normalized value. The correlation threshold value is processed by involving any sensed characteristics by one or more sensing circuits in the power/supply rails, and/or any feedback output (operational status) from the system.

Turning to FIG. 1, FIG. 1 depicts Power Supply 100 providing current (and/or voltage) to the invented System Latchup Detection and Protection (SLDAP) Circuit 140 and COTS (Commercially-Off-The-Shelf) System 120. The COTS System 120 may be commercially available, e.g., a GPS system, or it may be propriety, i.e., not commercially available. Although the invented SLDAP Circuit 140 is depicted here as a separate entity to the COTS System 120, it may be incorporated into the COTS System 120. For sake of readability, the invented SLDAP Circuit 140 is described henceforth as a separate entity. The Electronics System 190 comprises our invented SLDAP Circuit 140 and the COTS System 120.

The Power Supply 100 and the COTS System 120 may be electrically coupled via a Power Rail 102, a Supply Rail 104, and a Switch 106. The Power Supply 100, via the Power Rail 102, the Switch 106, and the Supply Rail 104, may supply a combined current (and/or voltage) to an Onboard Power Management 122 in the COTS system 120. The Onboard Power Management 122, via the Distributed Power Rail 124, may further distribute current (and/or voltage) to power a number of COTS ICs, e.g., from the first COTS IC (COTS-1 130) to the n-th COTS IC (COTS-n 132).

Note that the COTS ICs may be that commercially available or it may be propriety. Further, as delineated in the "Background" section, a complex integrated circuit, such as an SoC (e.g., an FPGA) may be considered an electronic system and considered as embodying two or more ICs and/or two or more electronic devices. For example, COTS-1 130 and COTS-n 132 may be the same integrated circuit, e.g., two different parts or two electronic devices of an FPGA.

The Distributed Power Rail 124 may form a single or collective set of two or more Sub-power rails 126 to 128 to supply current (and/or voltage) to the various COTS ICs (or different parts of an integrated circuit). For example, the Sub-power Rail 126 may supply current (and/or voltage) to power COTS-1 130, the Sub-power Rail 128 may supply current (and/or voltage) to power COTS-n 132, and other sub-power rails (not shown) may supply current (and/or voltage) to other COTS ICs (not shown). The voltages of the Sub-power rails 126 and 128 and other sub-power rails may or may not be the same. The COTS System 120 may constitute varied configurations such as that comprising at least one integrated circuit (e.g., an FPGA) or COTS IC, an evaluation board of a COTS IC, a complex electronics system with a multiplicity of COTS ICs on a printed circuit board, and it may be that commercially available, proprietary, etc.

The Power Supply 100 may be a battery or from another power management system comprising a DC-DC converter (s), a low dropout (LDO) regulator, etc.

The combined current (and/or voltage) to the Onboard Power Management 122 in the COTS system 120 may need to be sensed/monitored for detection of an anomaly, e.g., an SEL or a micro-SEL. The sensing of the combined current (and/or voltage) may be placed on the Power Rail 102 or the Supply Rail 104. For illustration, in FIG. 1, the sensing of the combined current (and/or voltage) may take place on the Supply Rail 104 where the current in (and/or the voltage) of the Supply Rail 104 may be sensed/monitored as indicated by the Sensing Circuit 142 to the invented System Latchup Detection and Protection (SLDAP) Circuit 140; note that the Sensing Circuit 142 may be incorporated into the invented SLDAP Circuit 140.

By means of the Sensing Circuit 142, the SLDAP Circuit 140 may perform the necessary tasks to ascertain (i.e., detect or recognize) if an anomaly has occurred in one or more of the COTS ICs in the COTS System 120, e.g., one or more in the n COTS in FIG. 1, from COTS-1 130 to COTS-n 132. When an anomaly is detected, the SLDAP Circuit 140 may trigger the Control Line 144 to power cycle the Switch 106. Conversely, where an anomaly is not detected, the Control Line 144 may keep the Switch 106 closed, thereby electrically coupling the Power Rail 102 and the Supply Rail 104. The power cycling may involve reducing the voltage of the supply rail or the supply to a pre-determined voltage at least temporarily.

If the sensing of the combined current (and/or voltage) takes place on the Power Rail 102, the Sensing Circuit 142 may be re-located for sensing the Power Rail 102. By means of the Sensing Circuit 142 associated with the Power Rail 102, the SLDAP Circuit 140 and the Switch 106 may perform the same anomaly detection operation as delineated earlier.

For simplicity, the combined current (and/or voltage) to the COTS system 120 is termed as the combined sensing parameter where the parameter may be voltage or current or both current and voltage. Note that for current sensing, the Sensing Circuit 142 may include the insertion of an electronic element, e.g., a small resistor, within the Supply Rail 104 where the voltage across the said electronic element is an indication of the current flowing through it.

Collectively, the Switch 106, the Sensing Circuit 142, and the SLDAP Circuit 140 collectively form the embodiment of the invention termed as a SLDAP Apparatus 180. Further, the SLDAP Circuit 180 and the COTS Systems 120 constitute the Electronics System 190.

Consider the SLDAP Apparatus 180 where the intention is the detection of an anomaly in the COTS System 120, i.e., in at least one of the pins/pads (e.g., a VDD voltage input or an I/O) of at least one COTS IC that suffers from an anomaly. For example, consider the case where the Sub-power Rail 126 supplies current into (and/or voltage at) Pin 156 of the COTS-1 130, and the Sub-power Rail 128 supplies current into (and/or voltage at) Pin 158 of the COTS-n 132. When an anomaly occurs in a pin, the current in (and/or voltage at) that pin may experience unexpected instantaneous (and/or over a period of time) transients—unexpected in the sense that such transients do not occur in usual non-anomalous or nominal (usual) operation.

This anomaly current (and/or voltage) has the characteristics of an anomaly and is henceforth the basis of the anomaly 'signature' of that pin. For sake of clarity, note that "characteristics of an anomaly" and "anomaly signature" are henceforth used interchangeably. The anomaly signature may include any spatial, temporal, chronological signals and derivations associated with the transients, and signal processing perspectives such as in the frequency domain and other transformations, direct, indirect, linear, non-linear, iterative, recursive, by means of machine learning (artificial intelligence), etc.—discussed later. For example, when an SEL occurs in Pin 156 connected to Sub-power Rail 126, the unexpected instantaneous transient current 160 (and/or voltage) may be the basis of the SEL (anomaly) signature of Pin 156 of the COTS-1 130.

At the outset, note that it is desirable (but not necessary) that all anomaly signatures of a given COTS IC and of all COTS ICs 130 to 132 in COTS System 120 are obtained so as to facilitate the detection of every possible anomaly. The anomaly signature of a specific pin (e.g., the 3.3V VDD input supply pin or the I/O pad) of a COTS IC may be obtained from measurements both in terms of the current into and the voltage at the pin of interest. This anomaly signature also in the voltage domain may be useful as the voltage often overshoots and/or undershoots when there are changes to the current, including during an anomaly. The anomaly signature may further include the current (and/or voltage) transients and/or waveform preceding the occurrence of an anomaly, instantaneous current (and/or voltage) at the juncture of the occurrence of an anomaly, and following the instance of the occurrence of an anomaly, i.e., a time frame comprising a series of current (and/or voltage) samples. The anomaly signature may further include frequency-domain transformations using the current (and/or voltage) transients from the time-domain, etc.

If a specific anomaly signature of a pin of a COTS IC cannot be obtained from measurements, a 'pseudo' anomaly signature such as the profile of an irregular current surge (and/or voltage transients) may be assumed to be the basis of an anomaly signature; irregular may be interpreted as unexpected, i.e., not resembling that in usual (i.e., non-anomalous) nominal 'error-free' operation or beyond what is expected or known to be when that COTS IC is operating normally. Further, the specific anomaly signature may also be modeled, or assumed, or estimated, or obtained from data science such as machine learning, etc. The term 'anomaly signature' henceforth would include that measured, modeled, assumed, estimated, or obtained from data science such as machine learning, etc.

Note that a typical COTS IC has several supply rail pads/pins and I/O pads/pins (e.g., same or different VDD and of the same or different voltages, analog VDD, digital VDD, etc.). An anomaly may occur in more than one supply rail or distributed power rails connected to one of the Sub-power Rails 126 to 128. In the following delineations, when a particular sub-power rail is referred to, it is assumed that there is a possibility that the referred sub-power rail may include more than one sub-power pin or pad of the COTS IC(s), and the various sub-power rails may be of the same or different voltages. Also, as delineated earlier, a complex integrated circuit, such as an SoC (e.g., an FPGA) may be considered an electronic system and considered as embodying two or more ICs and/or two or more electronic devices.

The basis of the anomaly signature is the current in (and/or the voltage) of Sub-supply Rail 126 when COTS-1 130 suffers from an anomaly. When an anomaly occurs, the anomaly signature in Sub-supply Rail 126 would also appear in Distributed Power Rail 124, possibly identically, or related to, or correlated to, or resembled in some related form—termed the 'Resembled Anomaly Signature'. For example, the unexpected Instantaneous Transient Current 162 (and/or voltage) may be the Resembled Anomaly Signature in Distributed Power Rail 124 having in some related form (or in some fashion, having some correlation) to the unexpected Instantaneous Transient Current 160 (and/or voltage) as the Anomaly Signature in the Sub-Supply Rail 126. The current in and/or voltage of the Distributed Power Rail 124 would further comprise the transients (and steady-state) of the operating currents in (and/or voltage) of the other COTS IC, including COTS-2 (not shown) to COTS-n 132.

In the Supply Rail 104, a 'Further-Resembled Anomaly signature' would be present—this may be identical, related, correlated to, or resembled in some form to the said Resembled Anomaly signature in Distributed Power Rail 124 and/or to the Anomaly signature in Sub-power Rail 126. For example, the unexpected instantaneous transient current 164 (and/or voltage) may be the basis of the Further-Resembled Anomaly signature. The transients (and steady-state) of the operating voltage and current in the Supply Rail

104 may be identical, related or correlated or resembling in some form to the operating voltage and current to the said COTS ICs (including COTS-2 (not shown) to COTS-n 132) would similarly be present. Put simply, when an anomaly occurs in COTS-1 130 in COTS System 120, the combined current in and voltage of the Supply Rail 104 would comprise both the Further-Resembled Anomaly Signature in some form (discussed later) and the operating (transients and steady-state) currents (and/or voltages) of COTS-2 (not shown) to COTS-n 132 in the COTS System 120.

Note that in response to an anomaly event on any of the COST ICs within the COTS System 120, the Anomaly signature, Resembled Anomaly signature and Further-Resembled Anomaly signature may be considered real-time, happening at the same time or almost at the same time, usually <500 μs, but could be longer depending on the delay due to the circuits in the electronics system, including the power management. For simplicity, an online Anomaly signature is used, where online refers to the availability of an anomaly signature and observable on a power rail, a supply rail, a distributed supply rail, or a sub-power rail. The online Anomaly signature may be a real-time Anomaly signature, a real-time Resembled Anomaly signature or a real-time Further-Resembled Anomaly signature.

The Anomaly signature, Resembled Anomaly signature and Further-Resembled Anomaly signature may be predetermined/pre-characterized—they may be obtained by measurements, modeled, assumed, estimated, or obtained from data science such as machine learning, etc.

In short, the SLDAP Apparatus 180 ascertains that an anomaly has occurred in the COTS System 120 on the basis of identifying that an online Signature (e.g., the Further-Resembled Anomaly Signature 164 in FIG. 1) is present in the Supply Rail 104. This means that the transients (instantaneous value or frames of values, transformations, etc., as delineated earlier) of the current in (and/or voltage) at the Supply Rail 104 is 'sufficiently similar' to a pre-characterized Anomaly signature; 'sufficiently similar' will be delineated in the signal processing section herein later. Put simply, the SLDAP Apparatus 180 detects an anomaly in the COTS System 120 by recognizing in some form the Further-Resembled Anomaly Signature (current and/or voltage) in the Supply Rail 104.

Figure 2B:
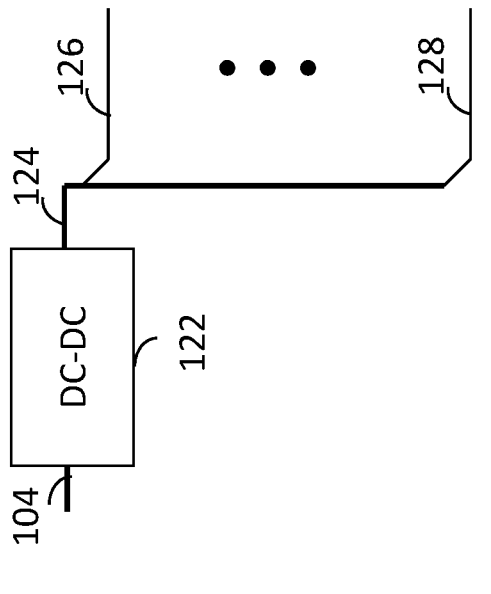
FIG. 2(B) is the onboard power management having a DC-DC converter within the COTS system.
Figure 2B:
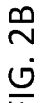
Figure 2A:
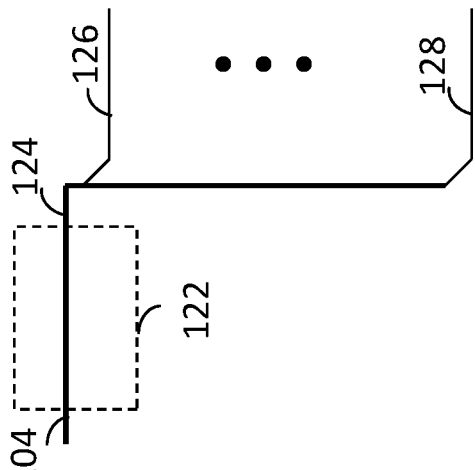
FIG. 2(A) is the onboard power management having a connector—a passive onboard power management comprising a short-circuit—within the COTS system.

Consider now the case where the Onboard Power Management 122 is simply a passive connector (a short-circuit) in FIG. 2(A), and that an anomaly occurs in the Sub-supply Rail 126. Because the Onboard Power Management 122 is a short-circuit, the Further-Resembled Anomaly Signature in the Supply Rail 104 would largely be the same as the Resembled Anomaly signature in the Distributed Power Rail 124 and as the Anomaly signature in the Sub-Power Rail 126.

Consider the case where the Onboard Power Management 122 is active (e.g., having a DC-DC Converter) in FIG. 2(B), and that an anomaly occurs in the Sub-supply Rail 126. The Further-Resembled Anomaly Signature in the Supply Rail 104 will likely be different but nevertheless having some resemblance or related or correlated to in some form to the Resembled Anomaly signature in the Distributed Power Rail 124 and to the anomaly in the Sub-supply Rail 126.

The Onboard Power Management 122 may have other configurations, e.g., having multiple DC-DC Converters (or circuits) powered by the Supply Rail 104 to provide more than one distributed power rails or sub-power rails, or having multiple DC-DC circuits to provide one or more distributed power rails or sub-supply rails. Despite these varied various configurations, the Further-Resembled Anomaly signature in the Supply Rail 104 will likely be different but nevertheless having some resemblance or related or correlated in some form to the Resembled Anomaly Signature in the distributed power rail(s) and to the Anomaly Signature in the sub-power rail(s).

For completeness, note that an anomaly may also occur in the Onboard Power Management 122. If the anomaly occurs in the Onboard Power Management 122, the detection mechanism(s) by the SLDAP Apparatus 180 delineated above would likewise apply.

Figure 3:
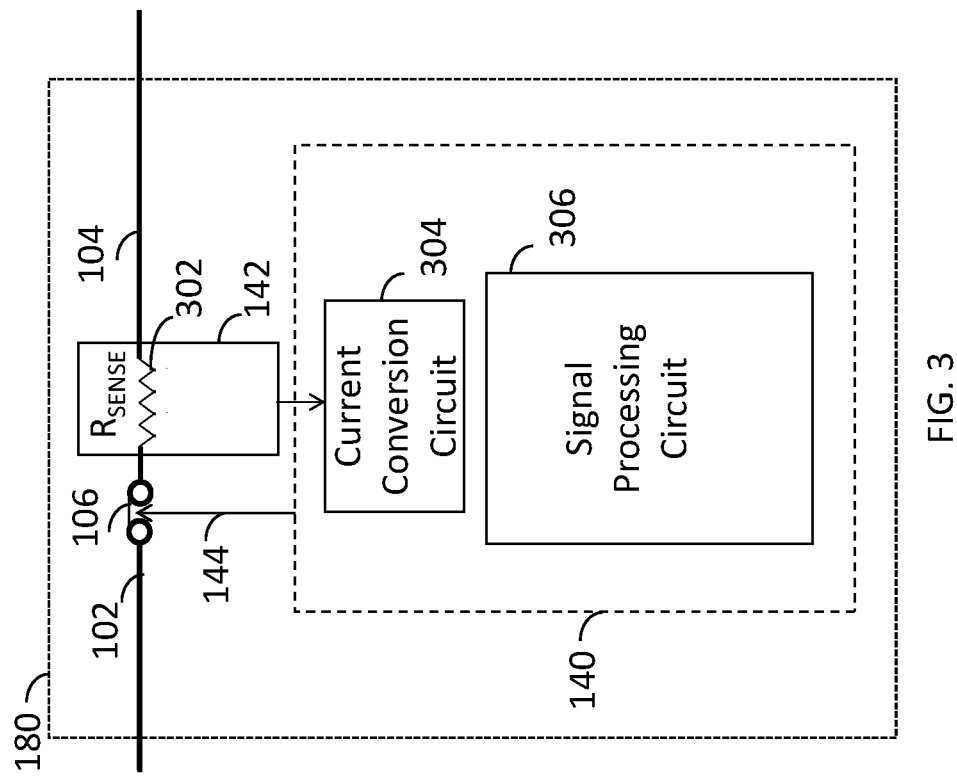
FIG. 3 is a block diagram of the anomaly detection methodology in FIG. 1 according to an embodiment of the invention.

FIG. 3 depicts the building blocks of the SLDAP Apparatus 180, having the Switch 106, the Sensing Circuit 142 having a sensor (e.g., resistor) R$_{sense}$ 302, the SLDAP Circuit 140 having a Current Conversion Circuit 304 and a Signal Processing Circuit 306. Note that the Current Conversion Circuit 304 may also be a voltage conversion circuit or both a current and voltage conversion circuit. For sake of brevity, the following delineation is largely on current—note that the signal of interest may also be voltage or a combination of current and voltage.

The sensor R$_{sense}$ 302 is used to sense the combined current flowing into the COTS System 120. The sensing may be achieved by measuring the voltage (V) across R$_{sense}$ and dividing V by R$_{sense}$. The sensing operation may be achieved by a comparator embodied in the Sensing Circuit 142. The Current Conversion Circuit 304 processes the combined current into the processed combined current to allow the Signal Processing Circuit 306 to identify, detect or qualify if an anomaly has occurred in any of the COTS ICs in the COTS System 120. The processed combined current obtained from the combined current may be in digital form or analog/mixed-signal form. The Signal Processing Circuit 306 may process the processed combined current in a digital modality or in an analog/mixed-signal modality or in a combined digital and analog/mixed-signal modality.

Figure 4:
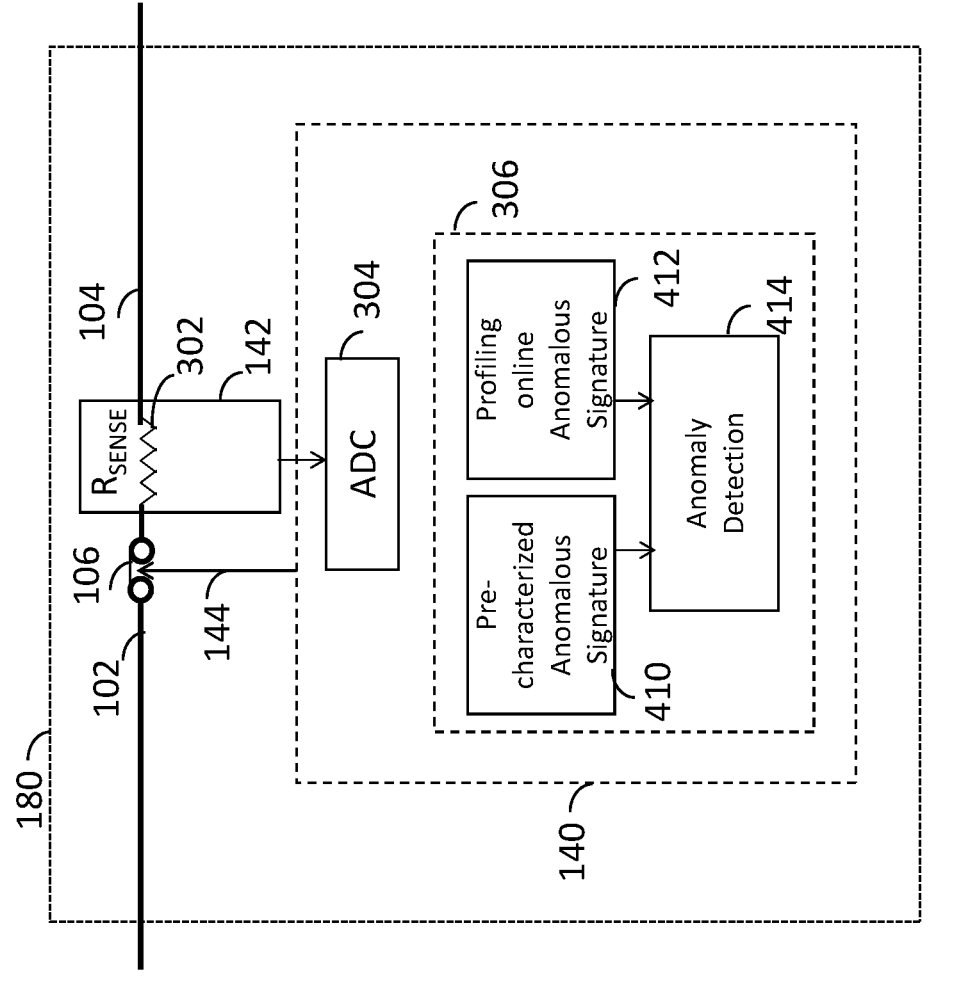
FIG. 4 is a block diagram of the anomaly detection methodology in FIG. 3 according to an embodiment of the invention.

For illustration based on the digital modality, FIG. 4 depicts the building blocks with the SLDAP Circuit 140, having the Current Conversion Circuit 304 which is an analog-to-digital Circuit, and the Signal Processing Circuit 306 which comprises a pre-characterized Anomaly Signature block 410, a profiling online Anomaly Signature block 412, and an Anomaly Detection block 414. The pre-characterized Anomaly Signature block 410 stores the pre-characterized anomaly signatures. The profiling online Anomaly Signature block 410 profiles the processed combined current into useful online anomaly signatures so that the Anomaly Detection block 414 can correlate the similarity between the pre-characterized anomaly signatures and the online anomaly signature. If the similarity between the pre-characterized anomaly signatures and the online anomaly signature is high, i.e., the observability of the anomaly occurrence in the COTS system 120 can be observed, the SLDAP Circuit 140 can be configured to trigger the Control Line 144 to power cycle the Switch 106, enabling the power-cycling to the COTS system 120.

Figure 5B:
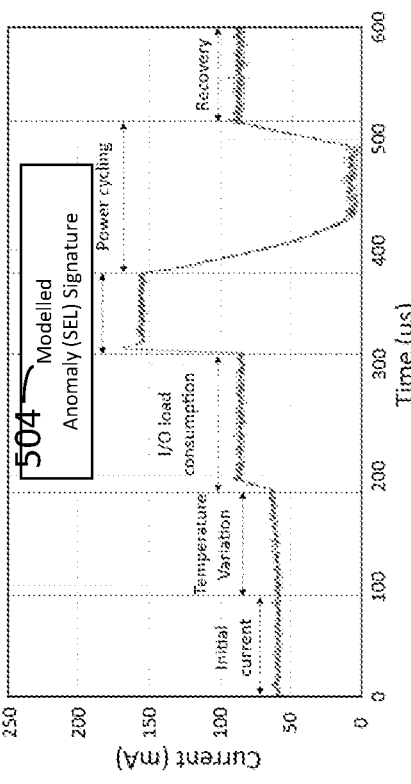
FIG. 5(B) is an example of a modelled Anomaly signature which may be influenced by other conditions such as temperature variation, loading conditions attributed by I/O circuits (and/or other circuits) and the impact due to power-cycling and recovery (e.g., re-start conditions).
Figure 5A:
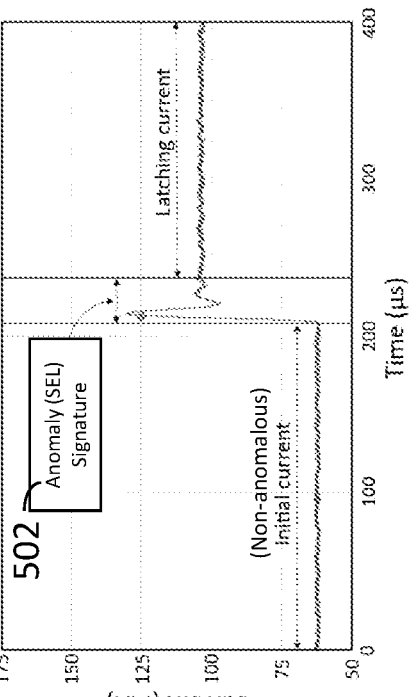
FIG. 5(A) is an example of anomaly signature—an SEL current profile extracted from an FPGA.

FIG. 5(A) depicts an example of anomaly signature 502 (e.g., of an SEL) extracted from an FPGA by means of laser testing. The anomaly signature may be extracted from other ICs, e.g., microcontrollers, mixed-signal chips, or customized/propriety ICs which may experience anomalies such as SEL under irradiation.

Note that the IC used for pre-characterization may or may not be the same as the IC embodied in the COTS System 120. For improved detection of an anomaly, it is desirable that the database of the pre-characterized anomaly signatures be large, including as many different conditions as possible, and of any other device (i.e., not necessarily the same devices in the COTS System 120 in FIG. 1). For example, in the case of radiation effects, it would be useful for the database to embody anomaly signatures from various irradiations, including heavy-ion, proton, neutron, photon, X-ray, electron beams, etc. FIG. 5(B) depicts an example of modelled Anomaly signature 504 which may be influenced by other conditions such as temperature variation, loading conditions attributed by I/O circuits (and/or other circuits) and the impact due to power-cycling and recovery (e.g., re-start conditions). The SEL signatures 502 and 504 are based on a current-time profile. The Anomaly signatures 502 and 504 may be transformed into other profiles, including in frequency domain.

Figure 6:
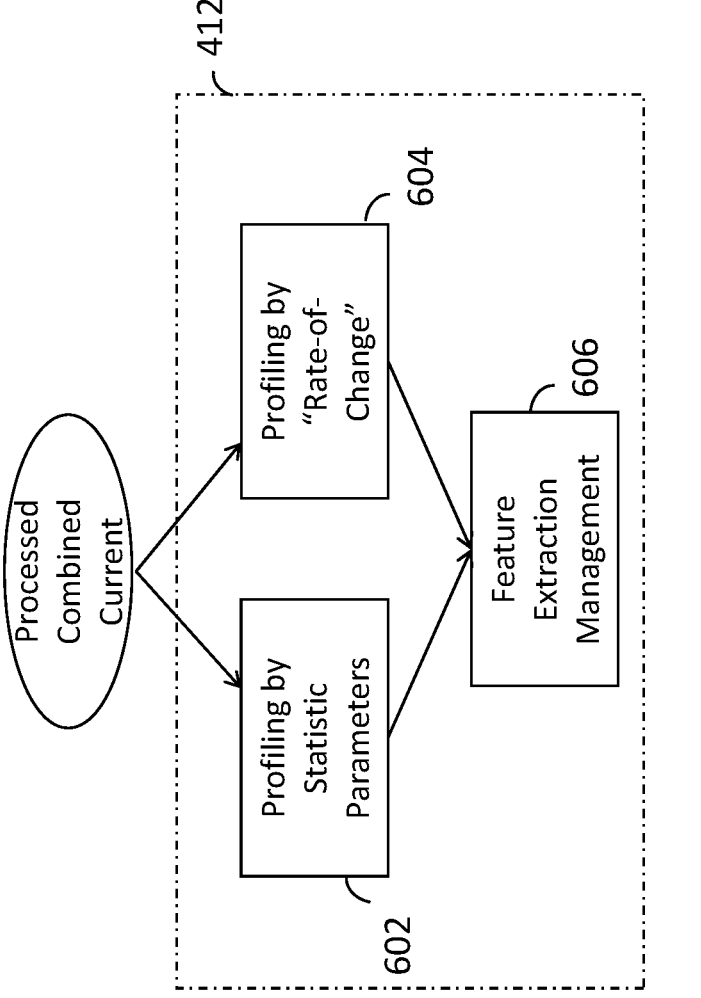
FIG. 6 is a Profiling Online Anomaly Signature block in FIG. 4 according to an embodiment of the invention.

FIG. 6 depicts the Profiling Online Anomaly Signature block 412. The profiling process may leverage on the statistic parameters based on the processed combined current—this profiling is termed as "Profiling by Statistic Parameters" 602. The parameters used may be maximum value, minimum value, mean, variance, standard variation, skewness, kurtosis, median-absolute deviation (MAD), k-statistic, and any combination of these statistical parameters. These statistical parameters are well-established in literature.

The profiling process may leverage on the rate of charge based on the processed combined current—this profiling is termed as "Profiling by Rate-of-Change" 604. The rate-of-change may be defined as R=unit change for function 1 divided by unit change for function 2. The function 1 is related to the processed combined current and the function 2 is related to the time unit. For example, a possible first rate-of-change may be defined as $R_1=\Delta I/\Delta t$ where I is the processed combined current, t is the time, $\Delta I$ is the change in the combined current, and $\Delta t$ is the unit change in time. A possible second rate-of-change be defined as $$R_2 = \Delta I_i^2 / \Delta t$$

where $$I_i^2$$

is the square of the processed combined current, t is the time, $$\Delta I_i^2$$

is the change in the square of the processed combined current, and $\Delta t$ is the unit change in time. A possible third rate of change merit may be defined as $$R_3 = \Delta I_i^2 / \Delta t^2$$

where $$I_i^2$$

is the square of the processed combined current, $t^2$ is the square of time, $$\Delta I_i^2$$

is the change in the square of the processed combined current, and $\Delta t^2$ is the change in the square of time. Various other ways may be possible, by performing a mathematical transformation (e.g., addition, subtraction, multiplication, and division) on the function 1 and function 2.

Figure 7:
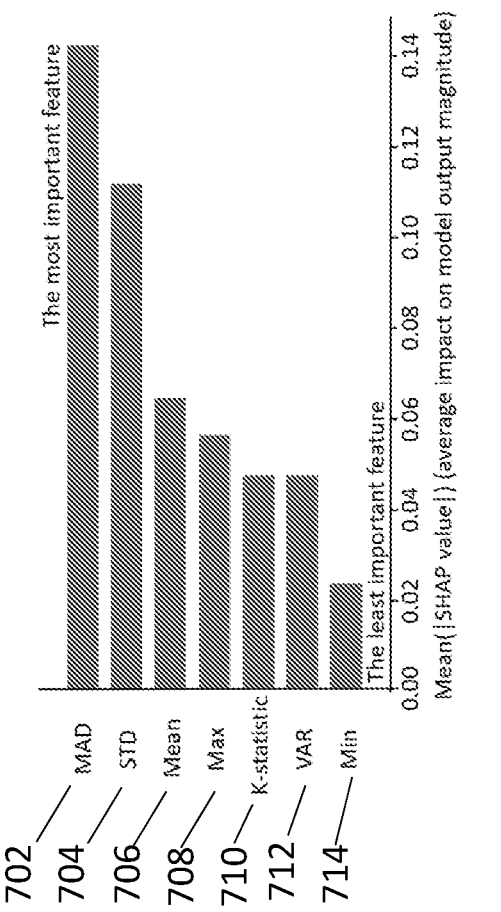
FIG. 7 is an example by ranking seven profiled parameters for the detection of an anomaly.

The profiled parameters either from Profiling by Statistic Parameters 602 or Profiling by "Rate-of-Change" 604 may be further managed by Feature Extraction Management 604. The Feature Extraction Management 606 may prioritize which profiled parameters (or features) having the possible highest impact for detection of an anomaly. FIG. 7 depicts an example by ranking seven profiled parameters, including MAD 702, Standard Derivation (STD) 704, Mean 706, Maximum Value (MAX) 708, K-statistic 710, Variance (VAR) 712, and Minimum Value (Min) for the detection of an anomaly, e.g., SEL. For this example, the evaluation indicates MAD 702 having the highest impact, and Min 714 having the lowest impact. Having said that, a conservative approach may include all these parameters collectively for detection of an anomaly (at the cost of higher processing needs), and a customized approach may include the top four parameters for the detection of an SEL.

Figure 8:
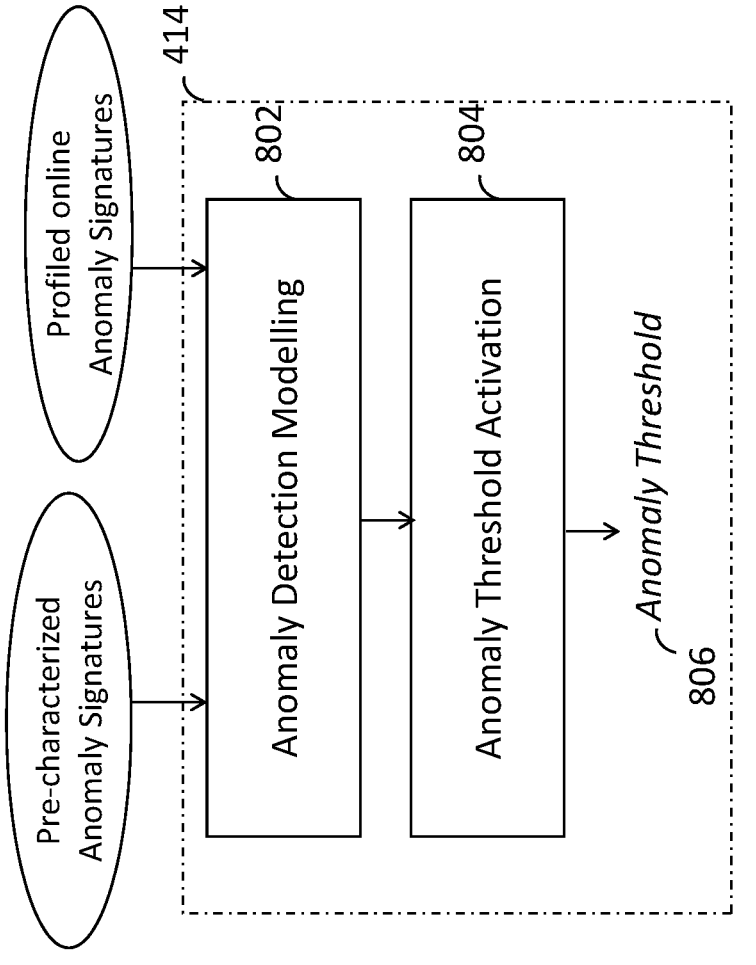
FIG. 8 is an Anomaly Detection block in FIG. 4 according to an embodiment of the invention.

FIG. 8 depicts the Anomaly Detection block 414 having an Anomaly Detection Modelling sub-block 802 and an Anomaly Threshold Sub-block 804. The Anomaly Detection Modelling sub-block 802 collectively analyzes the pre-characterized Anomaly Signatures and profiled online Anomaly Signatures, aiming to extract the salient features related to the Anomaly. The modelling algorithms may involve machine learning algorithms, by means of labelling, training and weighting the online Anomaly Signatures. The machine-learning detection algorithms may include decision tree, random forest, naïve bayes, support vector machine, K-nearest neighbors (KNN) or convolution neural network (CNN). The Anomaly Threshold Activation sub-block 804 may determine the anomaly threshold value, Anomaly Threshold 806, to be deemed as a probable anomaly observed by the SLDAP Apparatus 180 while monitoring the COTS system 120 for anomalies.

The value of Anomaly Threshold 806 may depend on the modelling algorithms and/or the profiled parameters. For example, using the random forest algorithm on the statistical parameters, the anomaly detection decision is binary, e.g., Anomaly Threshold 806 is asserted to '1' (or '0') for a probable anomaly event in the COTS system 120 or otherwise to '0' (or '1') for no-anomaly event observed in the COTS system 120. For another example, using the KNN algorithm on the statistical parameters, the anomaly detection decision is probability, e.g., Anomaly Threshold 806 is calculated to be >50% for a probable anomaly event in the COTS system 120 or otherwise to be <50% for no-anomaly event observed in the COTS system 120. For yet another example, using the correlation algorithm based on the rate-of-change parameters, the Anomaly Threshold 806 is the correlation coefficient which will be considered as a probable anomaly in the COTS system 120 if the correlation coefficient has >2 times change in magnitude between the non-anomaly operation vs anomaly operation. Otherwise, the no-anomaly event is considered.

For clarity, the above-mentioned anomaly detection decision is based on a correlation by establishing the similarity relationship between the pre-characterized Anomaly Signatures and profiled online Anomaly Signatures. The correlation may be considered as true when it exceeds a correlation threshold value. The correlation threshold value may be a binary value, a probability value, a relative change of normalized value, an absolute value, and other combination of these values.

Once a probable anomaly is determined, the SLDAP Circuit 140 may trigger Control Line 144, and may adjust the time duration to how Control Line 144 is to be activated.

Figure 9:
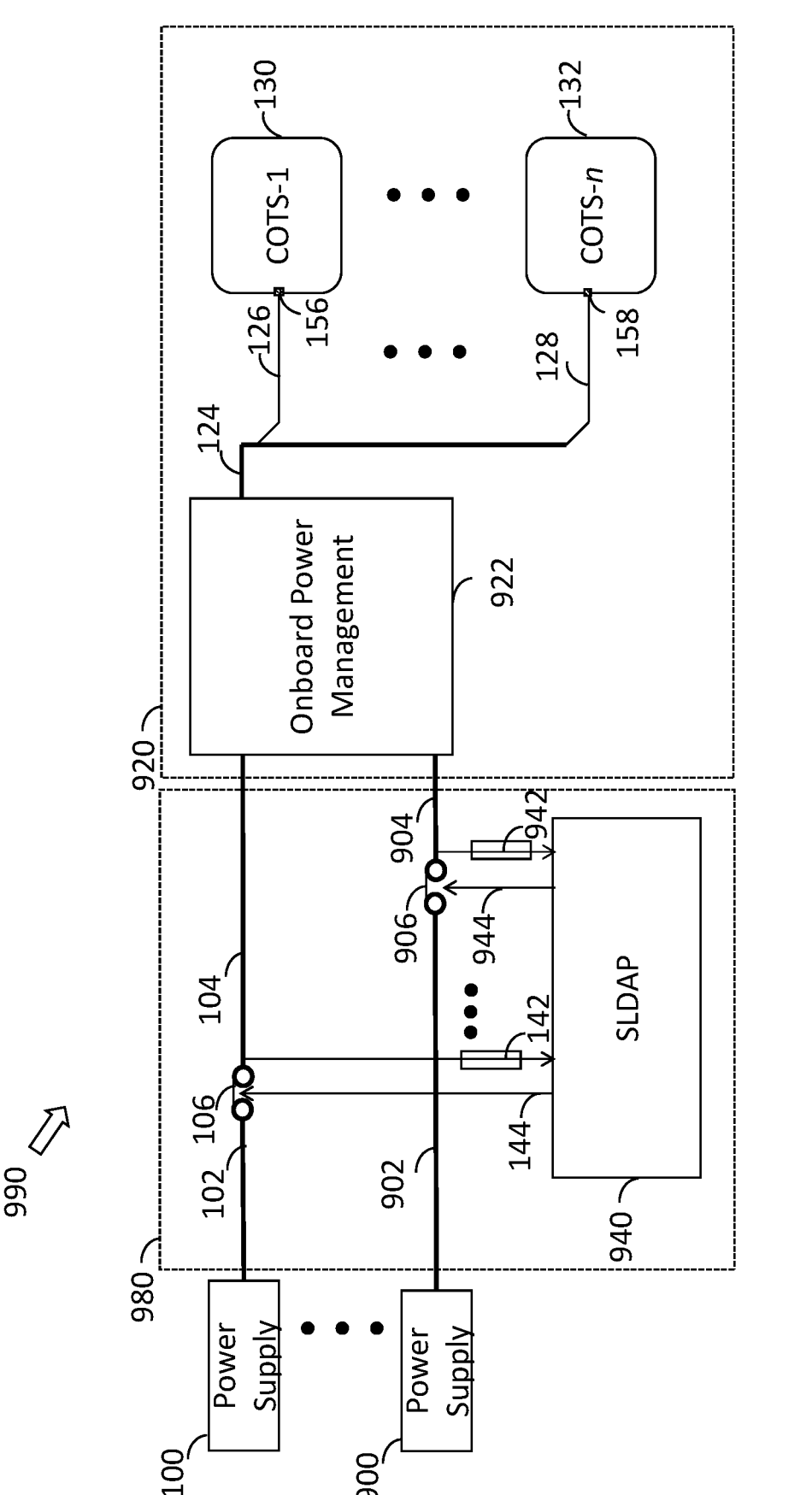
FIG. 9 is a second example of an electronic system having an anomaly detection methodology by sensing two supply rails according to an embodiment of the invention, to detect/qualify an anomaly occurring within at least one electronic device in a COTS system.

FIG. 9 further depicts second embodiment of an Electronics System 990 comprising invented SLDAP Apparatus 980 and COTS system 920, powered by two supply rails connected to two power supplies, Power Supply 100 and Power Supply 900. Note that although Power Supply 100 and Power Supply 900 are depicted as two entities, they can be one same entity. The voltage of Power Supply 100 and Power Supply 900 may be the same or they be different. For ease of comparison with FIG. 1, the various entitles in FIG. 1 are now referred to with a preceding 'First' in FIG. 9, where pertinent.

In this embodiment of the invention, the SLDAP Apparatus 980, has the First Power Rail 102, the First Supply Rail 104, the Second Power Rail 902, and Second Supply Rail 904. The First Power Rail 102 and Second Power Rail 902 may be connected to the Power Supply 100 and Power Supply 900 respectively. The First Supply Rail 104 which may be electrically coupled to the First Power Rail 102 via the Switch 106, and the Second Supply Rail 904 may be electrically coupled to the Second Power Rail 902 via the Switch 906. Both First and Second Supply Rails 104 and 904 are connected to the Onboard Management 922 in the COTS system 920.

The First Sensing Circuit 142 may sense the combined sensing parameter(s) on the First Supply Rail 104, and the Second Sensing Circuit 942 may sense the combined sensing parameter(s) on the Second Supply Rail 904. By means of the First Sensing Circuit 142 and/or the Second Sensing Circuit 942, the SLDAP Circuit 940 may perform the necessary tasks to ascertain (i.e., detect or recognize) if an anomaly has occurred in one or more of the n COTS in FIG. 9, from COTS-1 130 to COTS-n 132 in the COTS System 920. When an anomaly is detected, the SLDAP Circuit 940 may trigger the Control Line 144 to power cycle the Switch 106, or the Control Line 944 to power cycle the Switch 906, or both Control Lines 144 and 944 to power cycle both Switches 106 and 906. Conversely, where an anomaly is not detected, the Control Line 144 may keep the Switch 106 closed, and the Control Line 944 may keep the Switch 906 closed, thereby electrically coupling the First Power Rail 102 and the First Supply Rail 104, and electrically coupling the Second Power Rail 902 and the Second Supply 104. The anomaly detection within Signal Processing Circuit of the SLDAP Circuit 940 may leverage on the combined sensing parameter on the First Power Rail 104 and/or the combined sensing parameter on the Second Power Rail 904.

In the first variation of the second embodiment of the invention, the invented SLDAP Apparatus 980 may improve its detection of an anomaly in the COTS system 920 by correlating the combined sensing parameter(s) on the First Power Rail 104 and the combined sensing parameter(s) on the Second Power Rail 904.

In the second variation of the second embodiment of the invention, the invented SLDAP Apparatus 980 may improve its detection of an anomaly in the COTS System 920 by correlating the combined sensing parameter on the First Supply Rail 104 with the first embodiment (and its various variations) of the invention.

Figure 10:
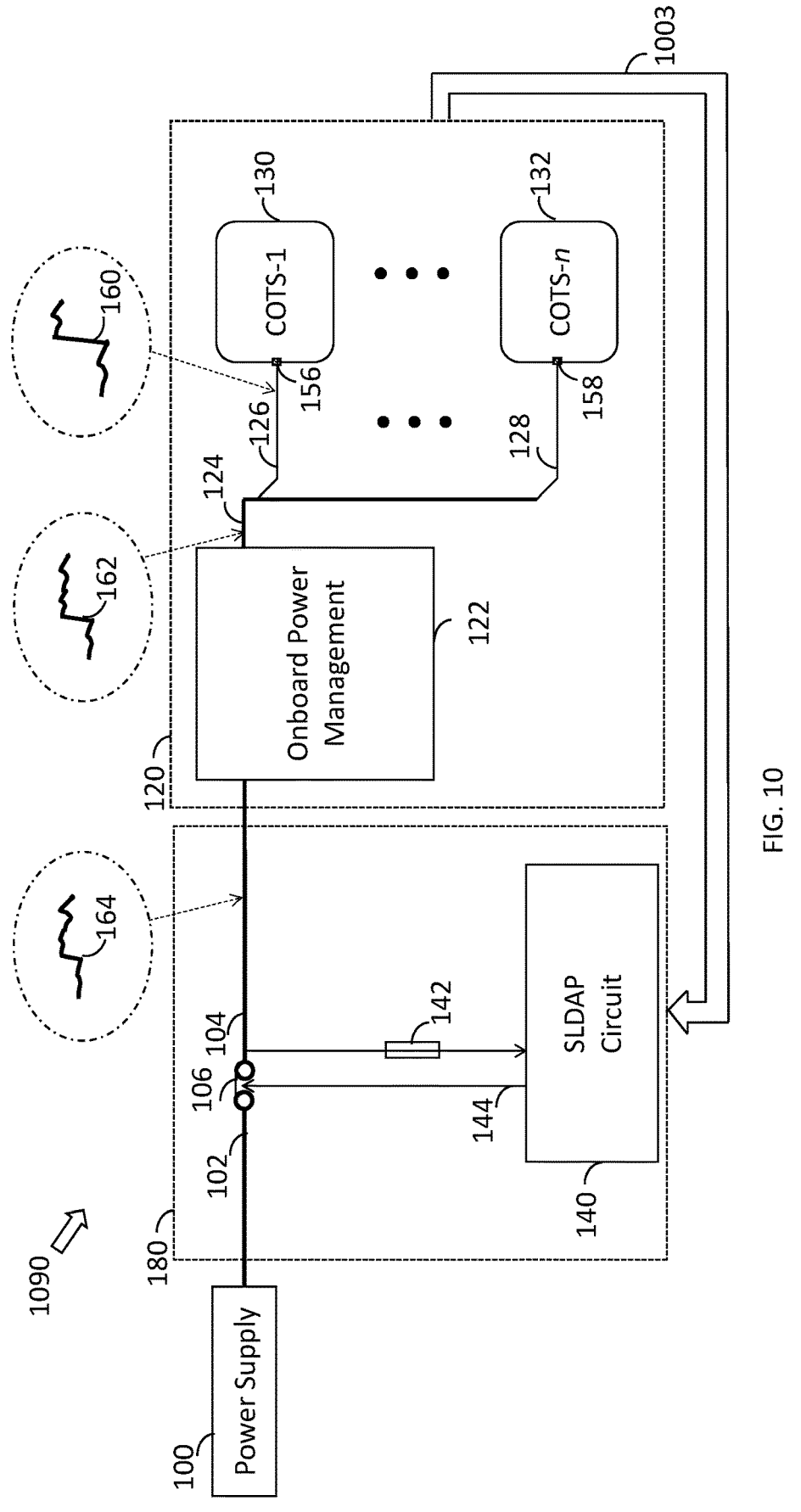
FIG. 10 is a third example of an electronic system having an anomaly detection methodology by sensing the supply rail and/or monitoring the output of a COTS system according to an embodiment of the invention, to detect/qualify an anomaly occurring within at least one electronic device in the COTS system.

FIG. 10 depicts the third embodiment of the invention where the Electronics System 190 in FIG. 1 is now reconfigured Electronics System 1090. In Electronics System 1090, the Output of the COTS System 1003 is input to (or feedback) to the invented SLDAP Apparatus 180. In this third embodiment of the invention, the invented SLDAP 180 may recognize that an anomaly has occurred in the COTS System 120 when the Output of the COTS system 1003 is unexpected, i.e., the output signal is unusual or unexpected. For example, consider that COTS System 120 that is expected to output a time signal ranging from 00:00:00:00 to 23:59:59:59. If the COTS System 120 however outputs a signal beyond these limits, the invented SLDAP Apparatus 180 may assume that one of the COTS ICs in the COTS System 120 has suffered an anomaly. In another example, if the same COTS system 120 unexpectedly outputs a repeated time signal, the invented SLDAP Apparatus 180 may similarly assume that one of the COTS ICs in the COTS system has suffered an anomaly. In yet another example, the Output of the COTS System 1003 is expected to pulse a signal every 10 ms. However, if it does not pulse every 10 ms, the output may be considered unexpected or unusual, i.e., an anomaly. When the invented SDLAP Apparatus 180 detects the occurrence of an anomaly, it would thereafter power cycle the COTS System 120 by opening First Switch 106 by means of First Control Line 144.

In the first variation of the third embodiment of the invention, the invented SLDAP 180 may improve its detection of an anomaly in the COTS System 120 by correlating the Output of the COTS System 1003 with the first embodiment (and its various variations) of the invention.

In the second variation of the third embodiment of the invention, the invented SLDAP 180 may improve its detection of an anomaly in the COTS System 120 by correlating the Output of the COTS System 1003 with the second embodiment (and its various variations) of the invention.

Although in most descriptions above, the current is the sensed parameter, note that both currents and voltages may be sensed. Further, variants of the current and/or voltage may also be sensed, for example, the differentiated or integrated versions thereto.

Also, most of the descriptions relate to current and/or voltage, and in most cases referred to in the time-domain. Note that these signals may be processed into the frequency-domain and processed by various signal processing algorithms.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

The invention claimed is:

1. An apparatus for detecting an anomaly in an electronic system comprising:

a power rail connected between a power source and a supply rail, the supply rail connected to a distributed power rail, the distributed power rail connected to a first sub-supply rail and to a second sub-supply rail, a first electronic device and a second electronic device, the first sub-supply rail connected to a first pin of the first electronic device or to a first pin of the second electronic device or to the first pin of both the first and the second electronic devices, the second sub-supply rail connected to a second pin of the first electronic device or to a second pin of the second electronic device or to the second pin of both the first and second electronic devices, a signal processing system comprising a sensing circuit and a processing unit, the sensing circuit senses the characteristics of the current, the voltage, or both the current and voltage of the power rail or the supply rail and detects the anomaly, the processing unit having pre-characterized anomaly characteristics of at least one of the first electronic device, the second electronic device, or of any other electronic device, the pre-characterized anomaly characteristics obtained by either measurement, estimation, modelling, machine-learning, or any combination of these, when the anomaly occurs in either the first electronic device or the second electronic device or both electronic devices, detecting the anomaly by sensing that the characteristics are different from that when the electronic system is functioning normally, the anomaly is detected by the processing unit correlating the pre-characterized anomaly characteristics of at least one of the first electronic device, the second electronic device or the any other electronic device or a combination of the first electronic device and the second electronic device and the any other electronic device with the characteristics of the current, the voltage, or both the current and voltage of the power rail or the supply rail sensed by the sensing circuit, and the pre-characterized anomaly characteristics of either the first electronic device, the second electronic device or the any other electronic device or that due to a combination of electronic devices are correlated to or in some fashion resembling or related to the characteristics of the current, the voltage, or both the current and voltage sensed by the sensing circuit.

2. The apparatus according to claim 1, wherein the anomaly is due to radiation effects or failure in either the first electronic device or the second electronic device, wherein the radiation effects include single-event effects, including single-event-latchup, single-event-transient and single-event-upset, or total-ionization dosage, or enhanced low dose rate effects, or neutron and proton displacement damage, and wherein the failure includes malfunction, or computation errors.

3. The apparatus according to claim 1, wherein when the anomaly is detected, the supply rail is disabled temporarily by disconnecting the supply rail from the power rail for at least some time, and thereafter reconnecting the supply rail with the power rail, or permanently by disconnecting the supply rail from the power rail.

4. The apparatus according to claim 3, wherein when the anomaly is detected, the voltage of the supply rail is at least temporarily lowered or discharged to a pre-determined voltage.

5. The apparatus according to claim 3, wherein the disconnection or the connection or both are realized by a switch placed between the power rail and the supply rail, and wherein the switch is either electronic or mechanical, or a combination of electronic and mechanical.

6. The apparatus according to claim 1, further comprising a power management circuit between the supply rail and the distribution power rail, wherein the anomaly now further arises from the power management circuit.

7. The apparatus according to claim 1, wherein when the anomaly occurs, the pre-characterized anomaly characteristics of the first electronic device or of the second electronic device or of the any other electronic device are different from the characteristics of the current, the voltage, or both the current and voltage sensed by the sensing circuit at the power rail or the supply rail.

8. The apparatus according to claim 1, wherein the processing unit has pre-characterized anomaly characteristics of the power rail or supply rail, and wherein the processing unit is analog, digital, or mixed-signal.

9. The apparatus according to claim 1, wherein the first electronic device and the second electronic device are part of a larger electronic device, and wherein the larger electronic device is a complex integrated circuit, a System-on-Chip, a Field Programmable Gate Array, or a module embodying several integrated circuits.

10. The apparatus according to claim 1, wherein the electronic system further comprises:

another power rail connected to the power source and to another supply rail, the power rail and the another power rail are of the same or different voltage, the another supply rail connected to another distributed power rail, the another distributed power rail connected to another first sub-supply rail and to another second sub-supply rail, the another first sub-supply rail connected to a third pin of the first electronic device, or to a third pin of the second electronic device, or to the third pin of both the first and the second electronic devices, the another second sub-supply rail connected to a fourth pin of the first electronic device or to a fourth pin of the second electronic device, or to the fourth pin of both the first and the second electronic devices, the signal processing system further comprising another sensing circuit, the another sensing circuit senses the characteristics of either the current, the voltage, or both the current or voltage of the another power rail or the another supply rail, and when the anomaly occurs in either the first electronic device or the second electronic device or both the electronic devices, the anomaly is detected by either the sensing circuit or the another sensing circuit or both the sensing circuit and the another sensing circuit sensing that the characteristics of the another power rail or the another supply rail are different from that when the electronic system is functioning normally.

11. The apparatus according to claim 10, wherein when the anomaly occurs, the anomaly is further detected by the processing unit correlating any of the following:

pre-characterized anomaly characteristics of either the first electronic device, the second electronic device or the any other electronic device or a combination of the first electronic device and the second electronic device and the any other electronic device, the characteristics of the current, the voltage, or both the current and voltage of the power rail or the supply rail sensed by the sensing circuit, or the characteristics of the either the current, the voltage, or both the current or voltage of the another power rail or the another supply rail sensed by the another sensing circuit.

12. An apparatus according to claim 1, wherein the electronic system has an output, wherein the output is input to the processing unit, and wherein the processing unit detects an anomaly in the electronic system by detecting that signals in the output are unusual or unexpected.

13. An apparatus according to claim 1, wherein the processing unit has a correlation threshold value, and wherein the anomaly is detected when a correlation exceeds the correlation threshold value.

14. The apparatus according to claim 13, wherein the processing unit employs statistical parameters of the characteristics of the current, the voltage, or both the current and voltage of the power rail or the supply rail sensed by the sensing circuit for its detection of the anomaly, and wherein the statistical parameters include any one or a combination of the following parameters derived from the characteristics of the current, the voltage, or both the current and voltage of the power rail or the supply rail sensed by the sensing circuit:

minimum, maximum, mean, variance, skewness, kurtosis, standard variation, median absolution deviation (MAD), k-statistic, and various rate of change of the characteristics of the signal sensed.

15. The apparatus according to claim 14, wherein the detection of the anomaly is facilitated by a machine-learning algorithm by labelling, training, and weighting the statistical parameters, and wherein the machine learning algorithm includes one or more or a combination of the following algorithms: decision tree, random forest, naïve bayes, support vector machine, K-nearest neighbours, and convolution neural network.

16. The apparatus according to claim 15, wherein the correlation threshold value is based on probability as a result of the machine learning algorithm, and wherein when the correlation threshold value exceeds 50%, an anomaly is assumed to have occurred.

17. The apparatus according to claim 15, wherein the machine learning algorithm for the detection of an anomaly is based on a correlation coefficient, and wherein the correlation threshold value is greater than two times the correlation coefficient in response to the occurrence of an anomaly over the non-occurrence of an anomaly.

18. The apparatus according to claim 1, wherein the power rail, or the supply rail, or both the power rail and the supply rail are external to the electronic system.

19. A method for detecting an anomaly in an electronic system comprising:

sensing, by a sensing circuit of a signal processing system in the electronic system, characteristics of the current, the voltage, or both the current or voltage of a power rail of the electronic system or a supply rail of the electronic system, wherein the power rail is connected to a power source and to the supply rail, wherein the supply rail is connected to a distributed power rail, wherein the distributed power rail is connected to a first sub-supply rail and to a second sub-supply rail, wherein the first sub-supply rail is connected to a first pin of a first electronic device or to a first pin of a second electronic device or to the first pin of both the first and the second electronic devices, and wherein the second sub-supply rail is connected to a second pin of the first electronic device or to a second pin of the second electronic device or to the second pin of both the first and the second electronic devices; and processing, by a processing unit of the signal processing system in the electronic system, the processing unit having pre-characterized anomaly characteristics of the first electronic device or of the second electronic device or of any other electronic device, the pre-characterized anomaly characteristics obtained by either measurement, estimation, modelling, machine-learning, or any combination of these;

when the anomaly occurs in either the first electronic device or the second electronic device or both the electronic devices, detecting the anomaly by the sensing circuit sensing that the characteristics are different from that when the electronic system is functioning normally, the anomaly is detected by the processing unit correlating the pre-characterized anomaly characteristics of the first electronic device, the second electronic device or the any other electronic device or a combination of the first electronic device and the second electronic device and the any other electronic device with the characteristics of the current, the voltage, or both the current and voltage of the power rail or the supply rail sensed by the sensing circuit, and the pre-characterized anomaly characteristics of either the first electronic device, the second electronic device or the any other electronic device or that due to a combination of electronic devices are correlated to or in some fashion resembling or related to the characteristics of the current, the voltage, or both the current and voltage sensed by the sensing circuit.

\* \* \* \* \*